(12) United States Patent
Dhong et al.

(10) Patent No.: US 7,170,316 B2
(45) Date of Patent: Jan. 30, 2007

(54) PROGRAMMABLE LOGIC ARRAY LATCH

(75) Inventors: Sang Hoo Dhong, Austin, TX (US);
Brian K. Flachs, Georgetown, TX (US); Joel A. Silberman, Somers, NY (US); Osamu Takahashi, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 70 days.

(21) Appl. No.: 10/982,018

(22) Filed: Nov. 5, 2004

(65) Prior Publication Data

US 2006/0097751 A1    May 11, 2006

(51) Int. Cl.
*H03K 19/177* (2006.01)
*G06F 7/38* (2006.01)

(52) U.S. Cl. ............................ 326/40; 326/39; 326/38
(58) Field of Classification Search ............ 326/38–41
See application file for complete search history.

(56) References Cited

U.S. PATENT DOCUMENTS 5,101,122 A * 3/1992 Shinohara ................... 326/44
5,221,867 A * 6/1993 Mitra et al. ................. 326/39

\* cited by examiner

*Primary Examiner*—Anh Q. Tran
(74) *Attorney, Agent, or Firm*—Robert M. Carwell; Dillon & Yudell LLP

(57) ABSTRACT

A programmable logic array (PLA) latch is disclosed. The PLA latch includes a first logic array, a second logic array and only one output latch. The second logic array is coupled to the first logic array. The output latch is coupled to the second logic array.

16 Claims, 3 Drawing Sheets

PROGRAMMABLE LOGIC ARRAY LATCH

BACKGROUND OF THE INVENTION

1. Technical Field

The present invention relates to programmable logic arrays (PLAs) in general, and, in particular, to PLAs used a speed-critical digital system. Still more particularly, the present invention relates to a PLA latch.

2. Description of Related Art

Programmable Logic Arrays (PLAs) are widely used in digital systems to provide programmable logic functions at a relatively low cost. In addition to various control functions, a conventional two-level PLA typically includes two separate logic arrays.

Referring now to the drawings and in particular to FIG. 1, there is illustrated a block diagram of a two-level PLA, according to the prior art. As shown, a two-level PLA 10 includes a first logic array 11, a second logic array 12, an input latch 13 and an output latch 14. First logic array 11 may include, for example, an array of AND functions. Second logic array 12 may include, for example, an array of OR functions.

Accesses to two-level PLA 10 requires several steps. First, input data are latched in input latch 13 before sending to first logic array 11. Next, first logic array 11 is instructed to process the input data, and second logic array 12 is similarly instructed to process the outputs of first logic array 11. Finally, output data are latched in output latch 14 to indicate that the output of two-level PLA 10 now has valid data.

Access speeds to two-level PLA 10 are mainly affected by two parameters. The first parameter, which is known as the access time, describes the time between the requested access to two-level PLA 10 and the output of valid data. The access time of two-level PLA 10 is typically one cycle. The second parameter, which is known as the response time, describes the time for the outputs to reflect as the state of the inputs as soon as possible.

The present disclosure provides architectural improvements to two-level PLA 10 in order to reduce access time and/or response time.

SUMMARY OF THE INVENTION

In accordance with a preferred embodiment of the present invention, a programmable logic array (PLA) latch includes a first logic array, a second logic array and only one output latch. The second logic array is coupled to the first logic array. The output latch is coupled to the second logic array.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1:
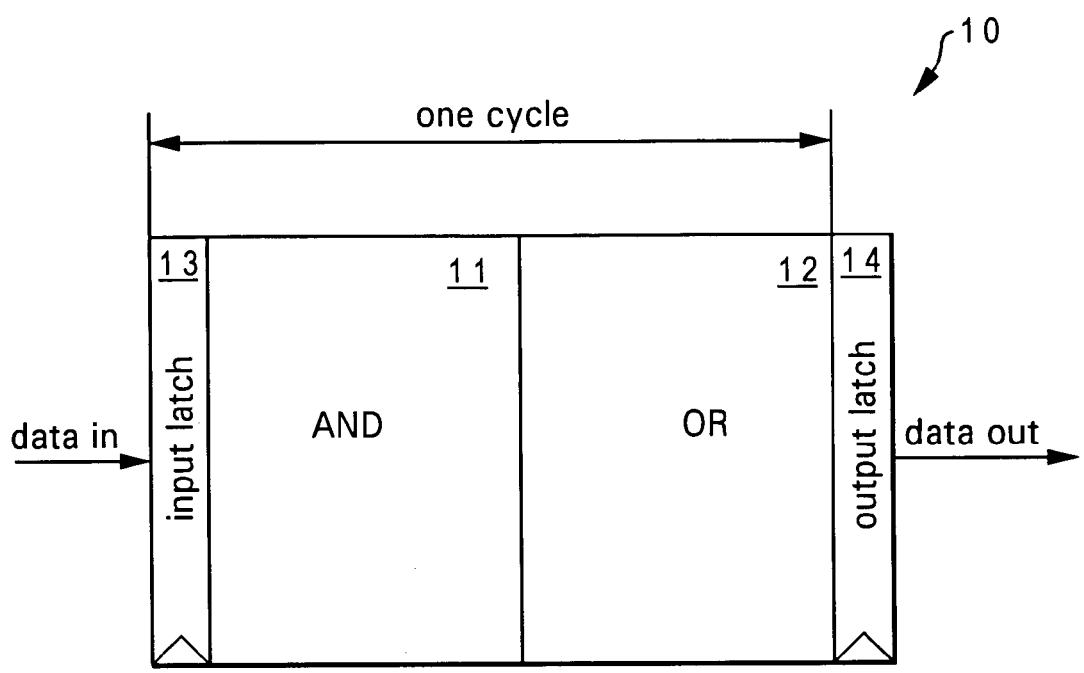
FIG. 1 is a block diagram of a programmable logic array (PLA), according to the prior art.

A traditional programmable logic array (PLA) design, such as two-level PLA 10 from FIG. 1, is bounded by an input latch and an output latch, and uses a full cycle access. The present invention combines the AND and OR functions of a PLA with an output latch to form a PLA latch that is capable of performing the same function as the traditional PLA in less than one cycle.

Figure 2:
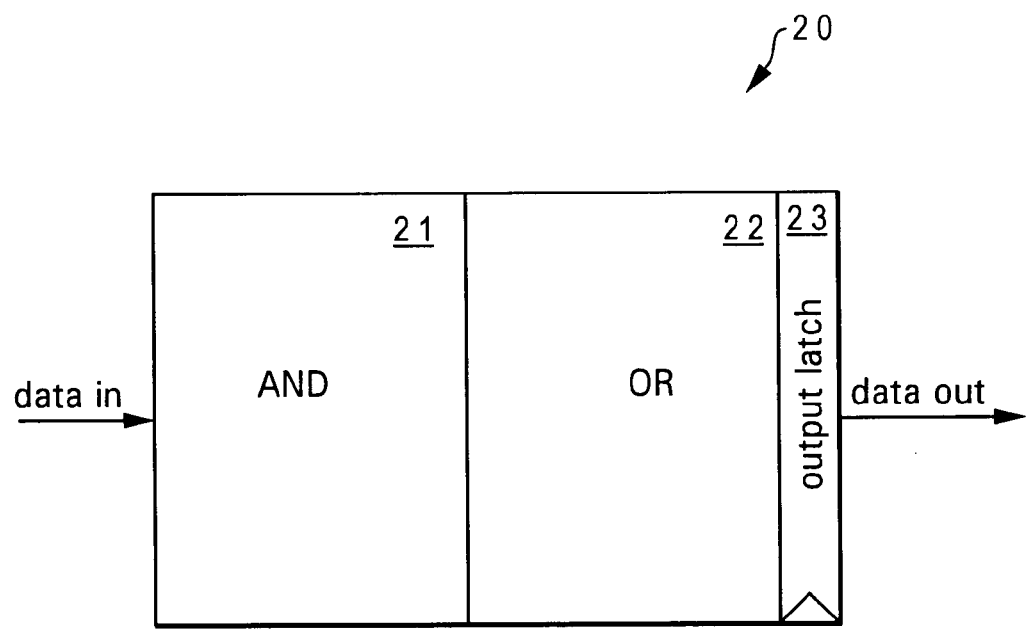
FIG. 2 is a block diagram of a PLA latch, in accordance with a preferred embodiment of the present invention.

With reference now to FIG. 2, there is illustrated a block diagram of a PLA latch, in accordance with a preferred embodiment of the present invention. As shown, a PLA latch 20 includes a first logic array 21, a second logic array 22 and an output latch 23. First logic array 21 may include, for example, an array of AND functions, and second logic array 22 may include, for example, an array of OR functions.

Input data are initially sent to first logic array 21 in which the input data are processed. The output data from first logic array 21 are then processed by second logic array 22. Finally, the output data from second logic array 22 are latched in output latch 23 to indicate that valid data are available at the output of PLA latch 20.

Figure 3:
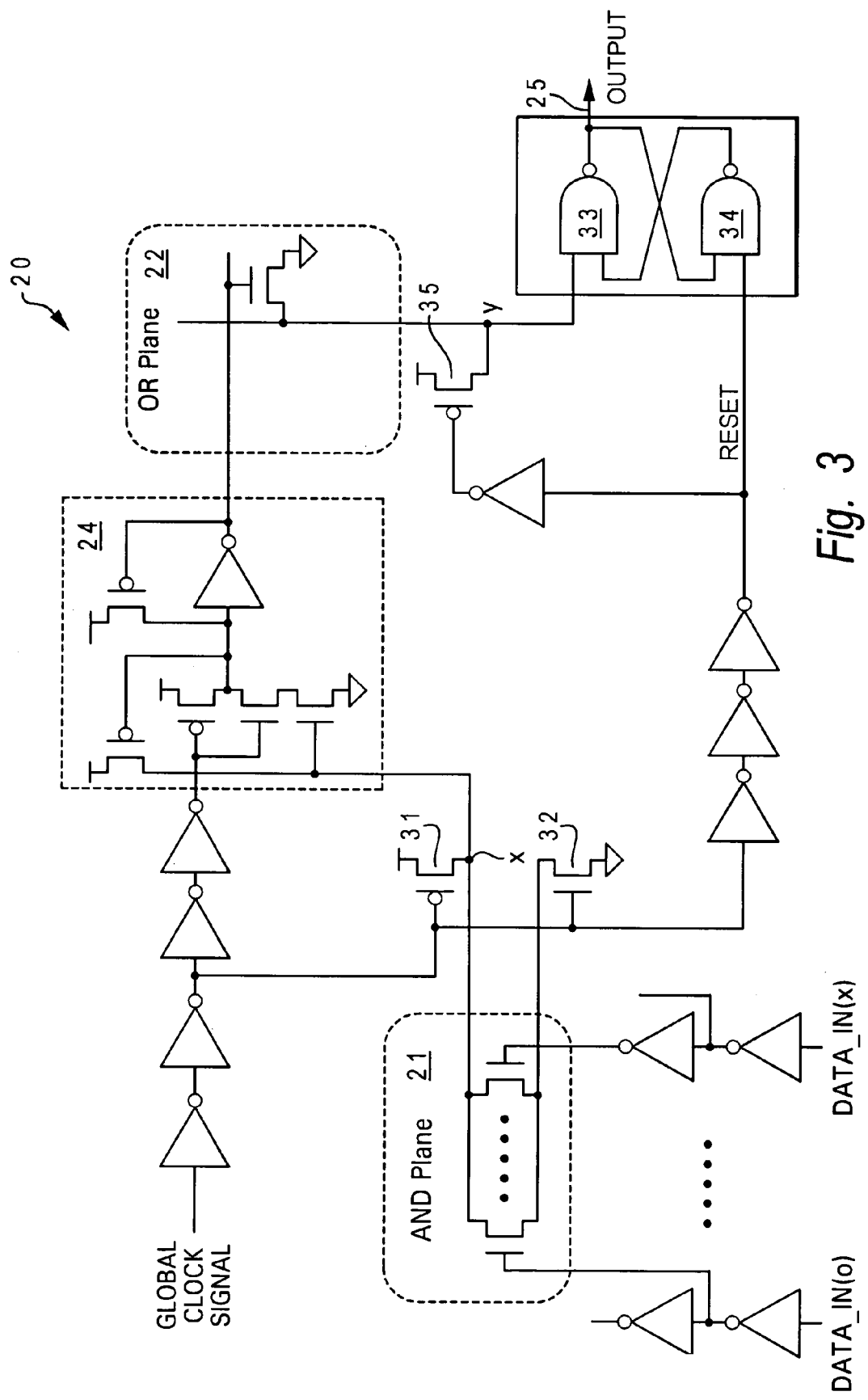
FIG. 3 is a schematic diagram of the PLA latch from FIG. 2, in accordance with a preferred embodiment of the present invention.

Referring now to FIG. 3, there is illustrated a schematic diagram of PLA latch 20, in accordance with a preferred embodiment of the present invention. As shown, PLA latch 20 initially receives a group of input data, such as data_in(0) through data_in(x), via first logic array 21. In the present embodiment, first logic array 21 is formed by a group of n-channel transistors connected in parallel to generate an AND logic function plane.

The output of first logic array 21 is sent to a strobe circuit 24. Strobe circuit 24 includes multiple p-channel and n-channel transistors and an inverter. Strobe circuit 24 provides a stopping point for the output signal from first logic array 21 that are well-known to those skilled in the art.

A precharge transistor 31 is connected to the output of first logic array 21 in order to precharge an AND node x. Precharge transistor 31 receives a global clock signal at its gate. The global clock signal is also sent to the gate of a foot transistor 32.

The output of strobe circuit 24 is subsequently sent to second logic array 22. In the present embodiment, second logic array 22 is formed by a group of n-channel transistors connected in series to generate an OR logic function plane. The output of second logic array 22 is sent to output latch 23.

A precharge transistor 35 is connected to the output of second logic array 22 (or an OR bitline) in order to precharge an OR node y. Precharge transistor 35 also receives the global clock signal at its gate.

In the present embodiment, output latch 23 is formed a pair of cross-coupled NAND gates 33–34. Specifically, the output of NAND gate 33 is fed to a first one of the two inputs of NAND gate 34, and the output of NAND gate 34 is fed to a first one of the two inputs of NAND gate 33.

The output of second logic array 22 is connected to a second one of the two inputs of NAND gate 33 (i.e., the data input of output latch 23). The global clock signal is fed to a second one of the two inputs of NAND gate 34 to serve as a RESET signal for output latch 23. An output 25 of PLA latch 20 is provided by the output of NAND gate 33.

Figure 4:
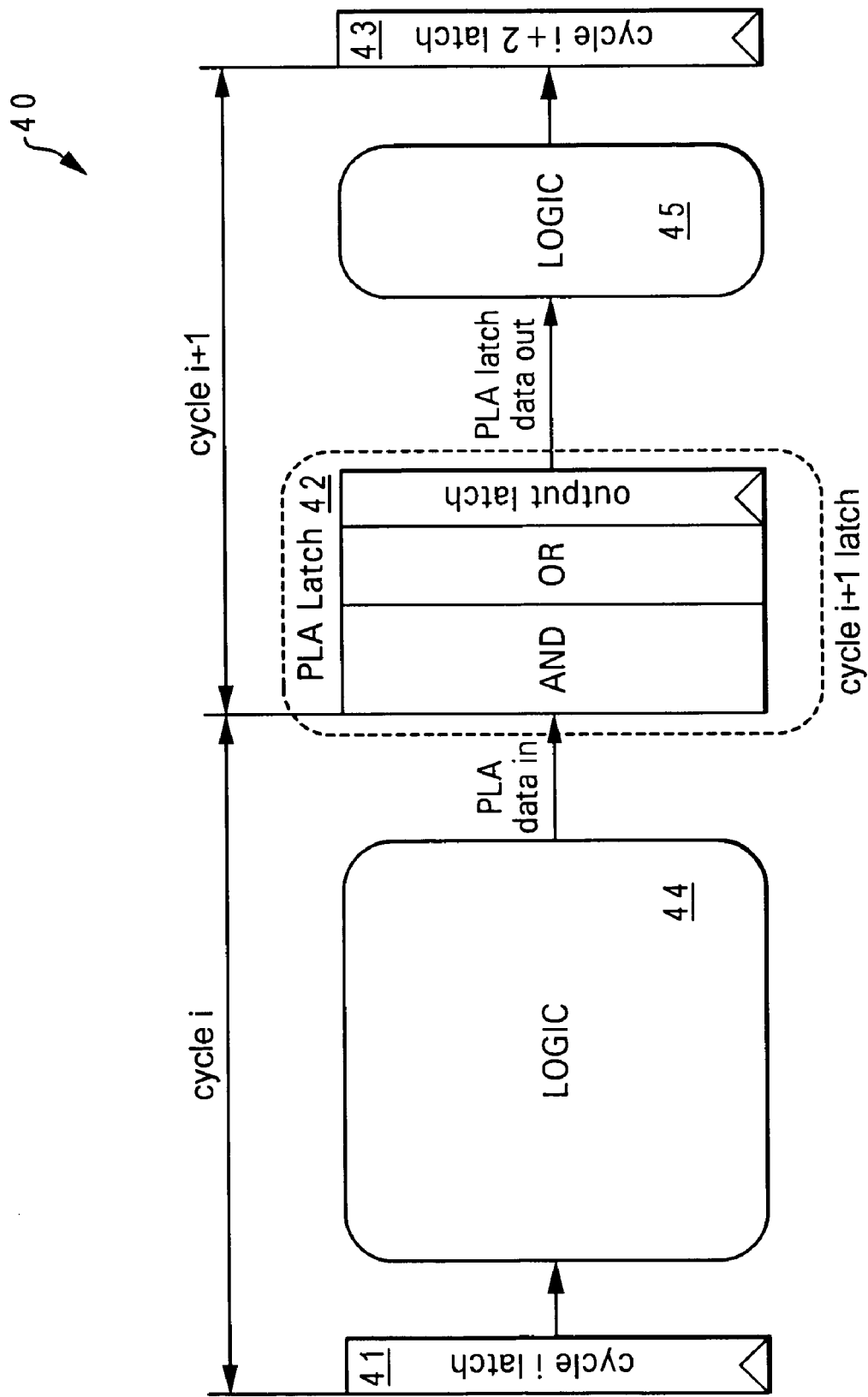
FIG. 4 is a block diagram of two PLA latches connected in series, in accordance with a preferred embodiment of the present invention.

PLA latch 20 can be cascaded with other PLA latches to be used in a pipeline of a digital system, as shown in FIG. 4. As shown, a pipeline 40 includes a PLA latch 41, a PLA latch 42 and a latch 43. PLA latch 41, PLA latch 42 and latch 43 are connected in series. Both PLA latch 41 and PLA latch 42 are substantially identical to PLA latch 20 from FIG. 3. Latch 43 may be a conventional latch that is well-known in the art.

PLA latch 41 represent a first stage of pipeline 40, PLA latch 42 represents a second stage of pipeline 40. PLA latch 41 performs its functions within a cycle i, and PLA latch 42 performs its functions within a cycle i+1. Since each of PLA latch 41 and PLA latch 42 can perform their respective functions in less than one cycle, addition logic can be inserted between latches. In the present embodiment, a group of logic 44 is inserted between PLA latch 41 and PLA latch 42. Similarly, a group of logic 45 is inserted between PLA latch 42 and latch 43.

Any of latches 41–43 can be implemented with either a PLA latch or a conventional PLA having two latches. If latches 41–42 were to be implemented with conventional PLAs, at least five conventional latches are required for pipeline 40. In contrast, pipeline 40 is only formed by three latches, which is less latches than the conventional PLA implementation.

As has been described, the present invention provides a PLA latch. The PLA latch combines the AND and OR functions with an output latch that is capable of performing the same function as the traditional PLA in less than one cycle.

For the sake of simplicity, only one or two devices are used to represent one plane for each logic function, such as AND plane and OR plane, it is understood by those skilled in the art that more than one or two devices are generally used to form the plane for each logic function.

While the invention has been particularly shown and described with reference to a preferred embodiment, it will be understood by those skilled in the art that various changes in form and detail may be made therein without departing from the spirit and scope of the invention.

What is claimed is:

1. A programmable logic array (PLA) latch comprising:
   a first logic array that evaluates a data input signal unqualified by any other signal within the PLA latch and without storage of said data input signal in said PLA latch, said first logic array having an output node;
   a second logic array coupled to said first logic array;
   a latch coupled to said second logic array that holds a data output obtained by operation of said second logic array; and
   a strobe circuit having an input coupled to the output node of said first logic array and an output coupled to said second logic array, wherein said strobe circuit sends a strobe signal to said second logic array.

2. The PLA of claim 1, wherein said first logic array is an AND function array.

3. The PLA of claim 1, wherein said second logic array is an OR function array.

4. The PLA of claim 1, wherein said output latch is formed by a pair of cross-coupled NAND gates.

5. The PLA of claim 4, wherein an output of a first NAND gate is fed to an input of a second NAND gate, and an output of said second NAND gate is fed to an input of said first NAND gate.

6. A processing pipeline comprising:
   multiple programmable logic array (PLA) latches each having:
     a first logic array that evaluates a data input signal unqualified by any other signal within the PLA latch and without storage of said data input signal in said PLA latch, said first logic array having an output node;
     a second logic array coupled to said first logic array;
     a latch coupled to said second logic array that holds a data result obtained by operation of said second logic array;
     a strobe circuit having an input coupled to the output node of said first logic array and an output coupled to said second logic array, wherein said strobe circuit sends a strobe signal to said second logic array; and
   a logic circuit coupled in series between first and second PLA latches among said multiple PLA latches.

7. The processing pipeline of claim 6, wherein said first logic arrays are AND function arrays.

8. The processing pipeline of claim 6, wherein said second logic arrays are OR function arrays.

9. The processing pipeline of claim 6, wherein each of said output latches is formed by a pair of cross-coupled NAND gates.

10. The processing pipeline of claim 9, wherein an output of a first NAND gate is fed to an input of a second NAND gate, and an output of said second NAND gate is fed to an input of said first NAND gate.

11. The PLA latch of claim 1, wherein:
    said strobe circuit is further coupled to receive a clock signal as input;
    propagation of data through said first PLA latch requires less than one cycle of said clock signal.

12. The PLA latch of claim 1, wherein:
    said strobe circuit is further coupled to receive a clock signal as input;
    said second logic array includes at least one bitline; and
    each PLA latch further includes:
      a first precharge circuit that precharges said output node of said first logic array in response to said clock signal; and
      a second precharge circuit that precharges said bitline in response to said clock signal.

13. The PLA latch of claim 1, wherein said latch comprises an unclocked latch.

14. The processing pipeline of claim 6, wherein:
    said strobe circuit is further coupled to receive a clock signal as input;
    propagation of data through, said first PLA latch and said logic circuit requires no more than one cycle of said clock signal.

15. The processing pipeline of claim 6, wherein:
    said strobe circuit is further coupled to receive a clock signal as input;
    said second logic array includes at least one bitline; and
    each PLA latch further includes:
      a first precharge circuit that precharges said output node of said first logic array in response to said clock signal; and
      a second precharge circuit that precharges said bitline in response to said clock signal.

16. The processing pipeline of claim 6, wherein the latch of each PLA latch comprises an unclocked latch.

* * * * *